United States Patent
Shishido et al.

(10) Patent No.: US 8,357,897 B2
(45) Date of Patent: Jan. 22, 2013

(54) CHARGED PARTICLE BEAM DEVICE

(75) Inventors: Chie Shishido, Kawasaki (JP); Atsushi Miyamoto, Yokohama (JP); Mayuka Iwasaki, Yokohama (JP); Tomofumi Nishiura, Kawasaki (JP); Go Kotaki, Kumamoto (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/146,436

(22) PCT Filed: Jan. 26, 2010

(86) PCT No.: PCT/JP2010/000423
§ 371 (c)(1),
(2), (4) Date: Sep. 14, 2011

(87) PCT Pub. No.: WO2010/087149
PCT Pub. Date: Aug. 5, 2010

(65) Prior Publication Data
US 2012/0104254 A1 May 3, 2012

(30) Foreign Application Priority Data
Jan. 28, 2009 (JP) ................. 2009-016550

(51) Int. Cl.
*H01J 37/26* (2006.01)
*G01N 23/00* (2006.01)
*G06K 9/00* (2006.01)

(52) U.S. Cl. ........ 250/310; 250/311; 250/306; 250/307; 250/492.22; 250/492.2

(58) Field of Classification Search ................. 250/311, 250/310, 306, 307, 492.22, 402.2; 356/237.1
See application file for complete search history.

(56) References Cited

U.S. PATENT DOCUMENTS

| | | | | |
|---|---|---|---|---|
| 7,269,287 | B2 * | 9/2007 | Shishido et al. | 382/207 |
| 7,460,714 | B2 * | 12/2008 | Shishido et al. | 382/207 |
| 7,817,860 | B2 * | 10/2010 | Shishido et al. | 382/207 |

FOREIGN PATENT DOCUMENTS

| | | |
|---|---|---|
| JP | 1-293478 | 11/1989 |
| JP | 6-110397 | 4/1994 |

(Continued)

OTHER PUBLICATIONS

Semiconductor Production Equipment and Technology, Part 5, Metrology, Semiconductor Equipment Association of Japan (SEAJ), Investigation Research Report (2003) with English translation from 4<sup>th</sup> line of p. 287-289.

*Primary Examiner* — Nikita Wells
(74) *Attorney, Agent, or Firm* — Antonelli, Terry, Stout & Kraus, LLP.

(57) ABSTRACT

A charged particle beam device enabling prevention of degradation of reproducibility of measurement caused by an increase of the beam diameter attributed to an image shift and having a function of dealing with device-to-device variation. The charged particle beam device is used for measuring the dimensions of a pattern on a specimen using a line profile obtained by detecting secondary charged particles emitted from the specimen when the specimen is scanned with a primary charged particle beam converged on the specimen. A lookup table in which the position of image shift and the variation of the beam diameter are associated is prepared in advance by actual measurement or calculation and registered. When the dimensions are measured, image processing is carried out so as to correct the line profile for the variation of the beam diameter while the lookup table is referenced, and thereby the situation where the beam diameter is effectively equal is produced irrespective of the position of the image shift. Whit this, measurement by the charged particle beam excellent reproducibility can be carried out.

10 Claims, 23 Drawing Sheets

FOREIGN PATENT DOCUMENTS

| | | |
|---|---|---|
| JP | 10-106469 | 4/1998 |
| JP | 2003-121132 | 4/2003 |
| JP | 2005-156436 | 6/2005 |
| JP | 2005-285746 | 10/2005 |
| JP | 2005-322423 | 11/2005 |
| JP | 2006-153837 | 6/2006 |
| JP | 2007-194007 | 8/2007 |
| JP | 2009-016181 | 1/2009 |

* cited by examiner

DIMENSION I

DIMENSION II

MATERIAL A
MATERIAL B

ADDING LINES

| SERIAL NUMBER | x COORDINATE (d x) (μm) | y COORDINATE (d y) (μm) | σ VALUE (nm) |
|---|---|---|---|
| 1 | -18 | -18 | 0.02 |
| 2 | -12 | -18 | 0.03 |
| 3 | -6 | -18 | 0.04 |
| 4 | 0 | -18 | 0.05 |
| ⋮ | ⋮ | ⋮ | ⋮ |
| 24 | -6 | 0 | 0.29 |
| 25 | 0 | 0 | 0.32 |
| 26 | 6 | 0 | 0.27 |
| ⋮ | ⋮ | ⋮ | ⋮ |
| 49 | 18 | 18 | 0.05 |

|   | No. | ACCELERATION VOLTAGE (V) | MODE | DATE OF DATA ACQUISITION | WAFER USED | COMMENT |
|---|-----|--------------------------|------|--------------------------|------------|---------|
|   | 1 | 1600 | H | 2008.5.23 | WAFER A0 | OPERATOR:X |
| ✓ | 2 | 800 | H | 2008.9.4 | WAFER A0 | OPERATOR:Y |
|   | 3 | 500 | L | 2008.10.10 | WAFER A1 | OPERATOR:Z |
|   | 4 | ... | ... | ... | ... | ... |
|   | 5 | ... | ... | ... | ... | ... |
|   | 6 | ... | ... | ... | ... | ... |

········· CORRECTION COEFFICIENT(0.25mm)
― ― ― CORRECTION COEFFICIENT(0.20mm)
―·― CORRECTION COEFFICIENT(0.15mm)
―··― CORRECTION COEFFICIENT(0.10mm)

| SERIAL NUMBER | x COORDINATE (d x) (μm) | y COORDINATE (d y) (μm) | DIMENSION OFFSET VALUE(nm) |
|---|---|---|---|
| 1 | -18 | -18 | -0.6 |
| 2 | -12 | -18 | -0.55 |
| 3 | -6 | -18 | -0.4 |
| 4 | 0 | -18 | -0.3 |
| ⋮ | ⋮ | ⋮ | ⋮ |
| 24 | -6 | 0 | -0.01 |
| 25 | 0 | 0 | 0 |
| 26 | 6 | 0 | -0.02 |
| ⋮ | ⋮ | ⋮ | ⋮ |
| 49 | 18 | 18 | -0.5 |

SPHERE OF IMAGE SHIFTING $\sigma_0$

SPHERE OF IMAGE SHIFTING $\sigma_{\pi/2}$

SPHERE OF IMAGE SHIFTING $\sigma_{\pi/4}$ $\pi/4$

CALCULATION METHOD
OF 2D GAUSS FUNCTION $$a^2 \cos^2 \theta + b^2 \sin^2 \theta = \sigma_0^2$$

$$a^2 \cos^2 (\theta + \frac{\pi}{2}) + b^2 \sin^2 (\theta + \frac{\pi}{2}) = \sigma_{\pi/2}^2$$

$$a^2 \cos^2 (\theta + \frac{\pi}{4}) + b^2 \sin^2 (\theta + \frac{\pi}{4}) = \sigma_{\pi/4}^2$$

$$\sigma_\phi = a^2 \cos^2 (\phi - \theta) + b^2 \sin^2 (\phi - \theta)$$

CHARGED PARTICLE BEAM DEVICE

TECHNICAL FIELD

The present invention relates to a charged particle beam device for measuring microscopic dimensions and, in particular, to such device for measuring pattern dimensions in semiconductor devices.

BACKGROUND ART

As described in Non-Patent Document 1, a critical dimension SEM which is a type of Scanning Electron Microscope (SEM) that is specialized for semiconductors is used for management of pattern dimensions in a semiconductor production process. The principle of the critical dimension SEM is shown in FIG. 2. A primary electron beam emitted from an electron gun 010 is narrowed and converged by convergence lenses 011 and a specimen is two-dimensionally scanned with the electron beam through a deflector 012 (scanning coil).

A detector 014 captures secondary electrons emitted from the specimen 020 as a result of irradiating the specimen 020 with the electron beam focused on the surface of the specimen 020 by an objective lens 013, with the result that an electron beam image is obtained. Because more secondary electrons are emitted from the edges of a pattern, the portions corresponding to the edges of the pattern are seen brighter in the electron beam image. A series of operations is carried out by a control unit 015.

The magnification of a scan image can be changed arbitrarily by a ratio between a scan width (fixed) on CRT and a scan width (variable) of the electron beam on the specimen. In FIG. 2, if the magnification of SEM is denoted by M and a pattern dimension on screen I, an actual dimension S is represented by I/M. In the critical dimension SEM, a position at which a dimension is to be measured is specified on a scan image and, then, the dimension is measured by executing a calculation depending on the applied magnification, using a signal waveform of that position.

Although different types of methods of automatic dimension measurement using signal waveforms have been proposed, a "threshold method" which is a typical method is shown in FIG. 3. As mentioned above, more secondary electors are emitted from the edges of a pattern. The portions having larger amplitudes of signal, corresponding to the left and right edges of the pattern, are to be denoted by a left white band (left WB) and a right white band (right WB), respectively. The threshold method obtains Max and Min values for the left and right WBs, respectively, calculates a threshold value from those values, detects a position at which a signal waveform intersects the threshold value as an edge portion, and determines a distance between left and right edges to be a dimension (CD) value. The threshold value in FIG. 3 can be determined arbitrarily by a user.

A sequence of an automatic dimension measurement, which is generally applied, is shown in FIG. 4. A wafer is loaded (step 101), a stage is moved in proximity to a dimension measurement location (step 102), and an image is captured at a low magnification on the order of 10,000 times (step 103). An accurate position of the dimension measurement location is determined by pattern recognition that uses a registered image as a template (step 104). By limiting a primary electron beam scan range to a narrower region around the determined position (step 105), an image is captured at a high magnification on the order of 150,000 times (step 106) and dimensions are measured (step 108).

The above operation that changes the image capturing position by changing the primary electron beam scan position without stage movement is to be referred to as an image shift. The reason why, after an image is captured at a low magnification, an image shift is performed and an image is captured again at a high magnification, without starting with capturing an image at a high magnification, is that it is generally hard to set a pattern to be measured covered in the region of a high magnification image due to insufficient precision of stopping the stage in place.

With further microfabrication of semiconductor patterns, measurement precision requirements of critical dimension (CD) SEMs become more strict year by year. In addition to requirements in terms of individual tool reproducibility of measurement for CD SEMs, existing heretofore, it becomes a significant challenge to reduce a difference between dimensions measured by respective devices (tool to tool matching), because a plurality of CD SEMs are often used together in view of a relationship between the processing capacity of a single CD SEM and the amount of semiconductor production.

PRIOR ART DOCUMENTS

Non-Patent Document

2003 Investigation Research Report on Semiconductor Production Equipment and Technology, Part 5, Metrology, Semiconductor Equipment Association of Japan (SEAJ)

DISCLOSURE OF THE INVENTION

Problems to be Solved by the Invention

While an image is captured at a high magnification after an image shift is performed as described above in the Background Art section, the larger the amount of image shift, the lower will be the resolution, as a characteristic of general SEM optics. This is because image shift results in aberration, thereby increasing an effective beam diameter.

In FIG. 5, given that image shift in x direction is dx, image shift in y direction is dy, by comparison between a dimension value (FIG. 5 (b)) measured by a line pattern image captured at a position I and a dimension value (FIG. 5 (c)) measured by a line pattern image captured at a position II ($|dx|>0$, $|dy|>0$), a larger beam diameter at the position II results in a lager dimension value measured. As mentioned above, because the stage stop position varies within a certain level of accuracy, this causes a variation in the amount of image shift with the result that measured dimension values vary.

In a case where one object is measured multiple times, if the amount of image shift varies for each measurement, reproducibility of measurement decreases, because measured dimension values vary for each measurement. If the degree of an increase in the beam diameter due to image shift differs between different CD SEMs, this may cause tool to tool matching (difference between dimension values measured by respective devices).

An object of the present invention is to prevent a decrease in reproducibility of measurement caused by an increase in the beam diameter attributed to image shift and provide a charged particle beam device having a function of coping with the occurrence of tool to tool matching.

Means of Solving the Problems

In order to achieve the foregoing object, the present invention resides in a charged particle beam device that scans a specimen with a primary charged particle beam converged on the specimen and measures dimensions of patterns on the specimen using line profiles obtained by detecting secondary charged particles emitted from the specimen, comprising: means for creating and holding a lookup table associating image shift positions with varying beam diameters of the primary charged particle beam; means for storing the image shift positions when obtaining the line profiles; means for calculating varying beam diameters when obtaining the line profiles by fitting the stored image shift positions in the lookup table; and means for reflecting the calculated varying beam diameters to dimension measurement processing.

Effect of the Invention

According to the present invention, varying beam diameters attributed to image shift are compensated for and, thus, a decrease in measurement reproducibility as well as tool to tool matching induced by the varying beam diameters are improved.

EMBODIMENTS FOR CARRYING OUT THE INVENTION

Although the prevent invention can be applied to various types of charged particle beam devices (SEM, FIB (Focused Ion Beam), etc.), its application to typically SEM is described in the following embodiments.

Embodiment 1

Figure 1:
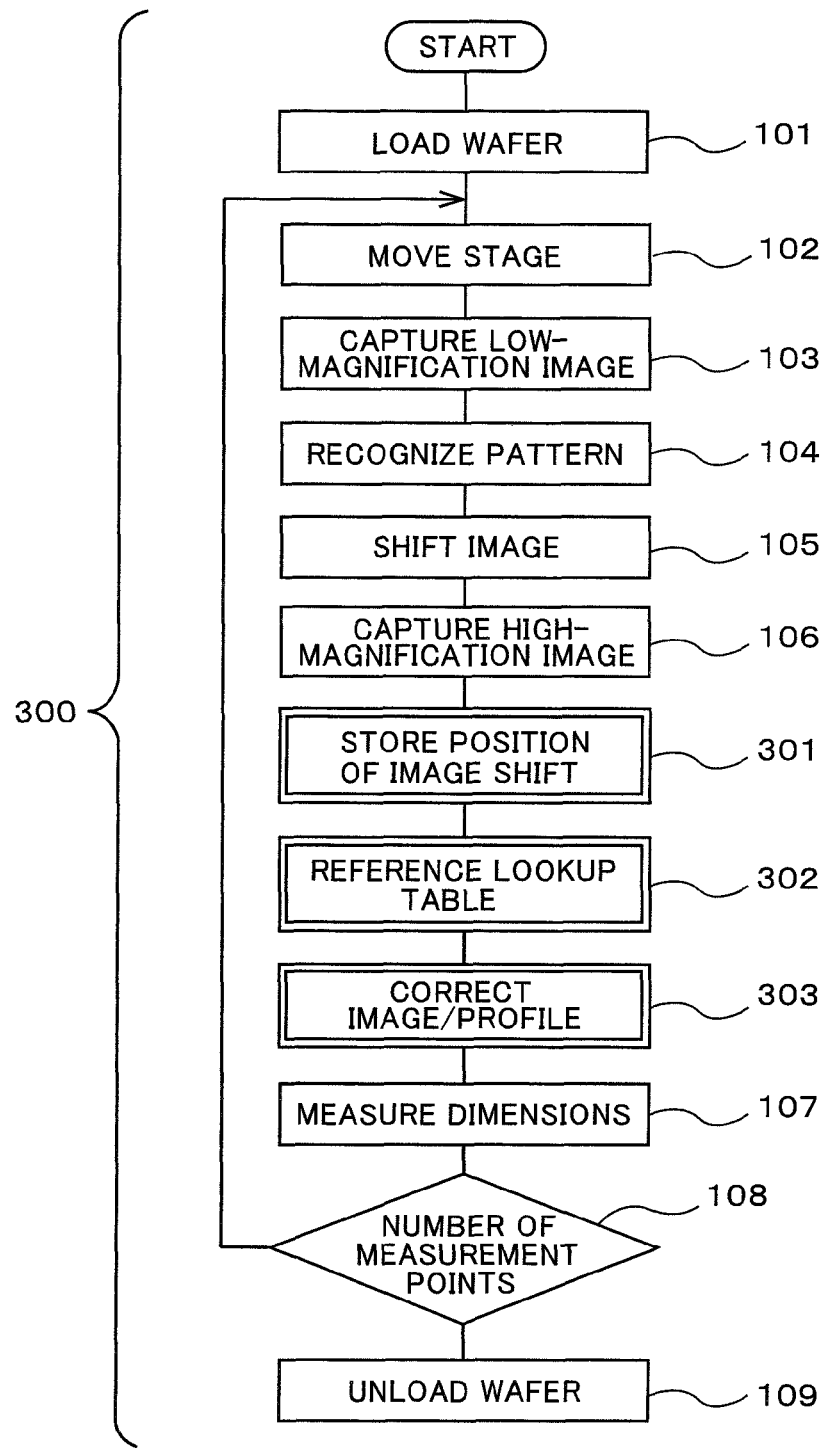
FIG. 1 is a flowchart to explain a first embodiment of the present invention.
Figure 2:
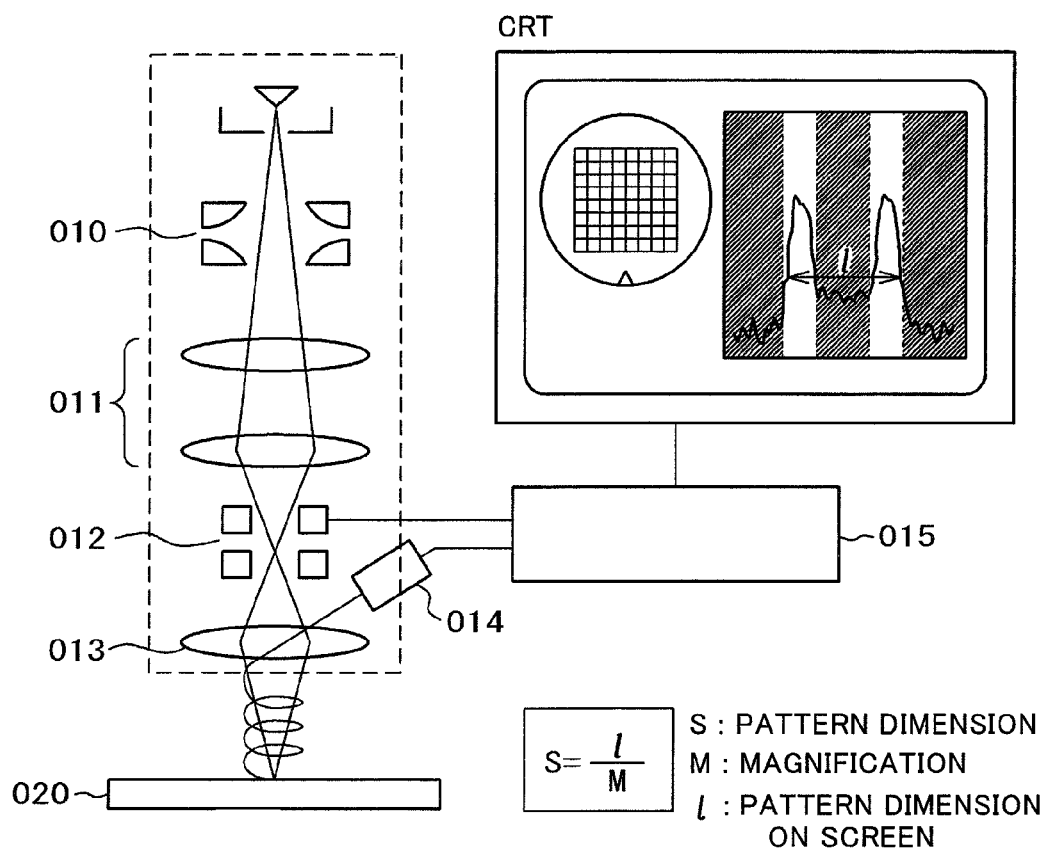
FIG. 2 is an explanatory diagram of a charged particle beam device pertaining to the present invention.
Figure 3:
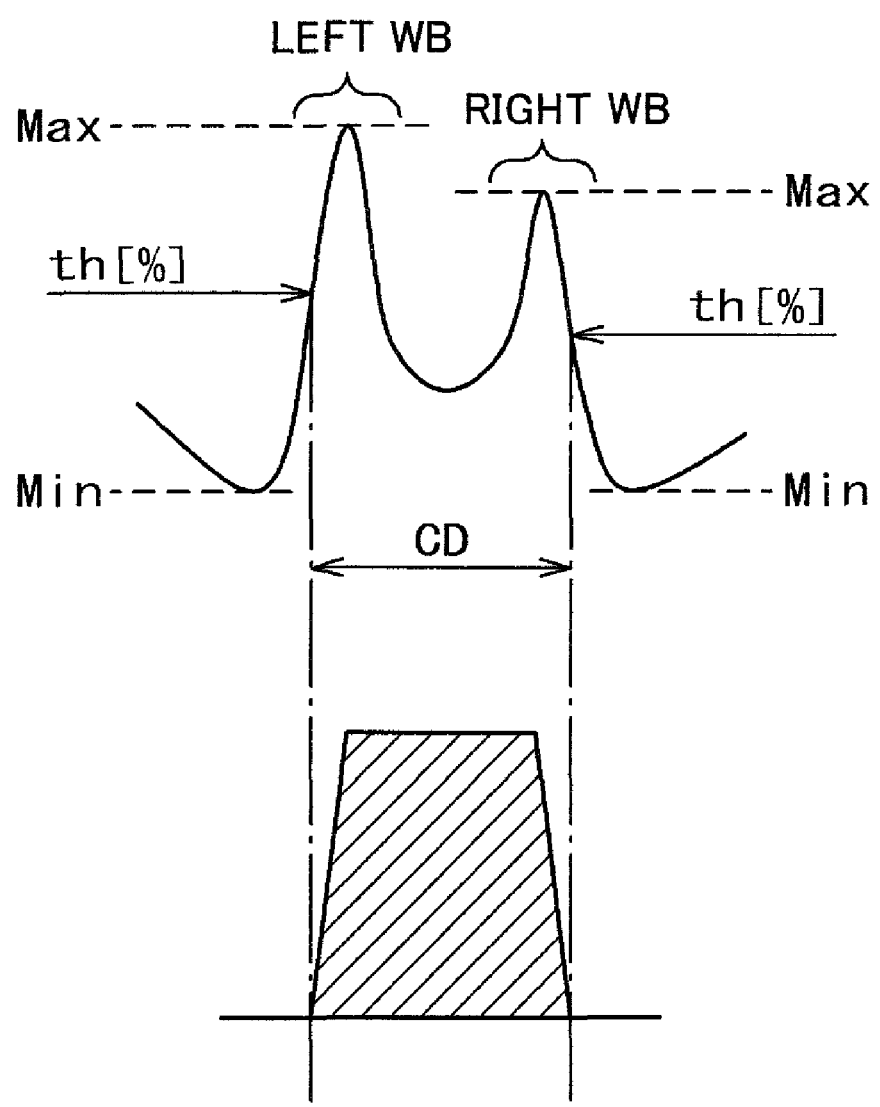
FIG. 3 is an explanatory diagram of prior art.
Figure 4:
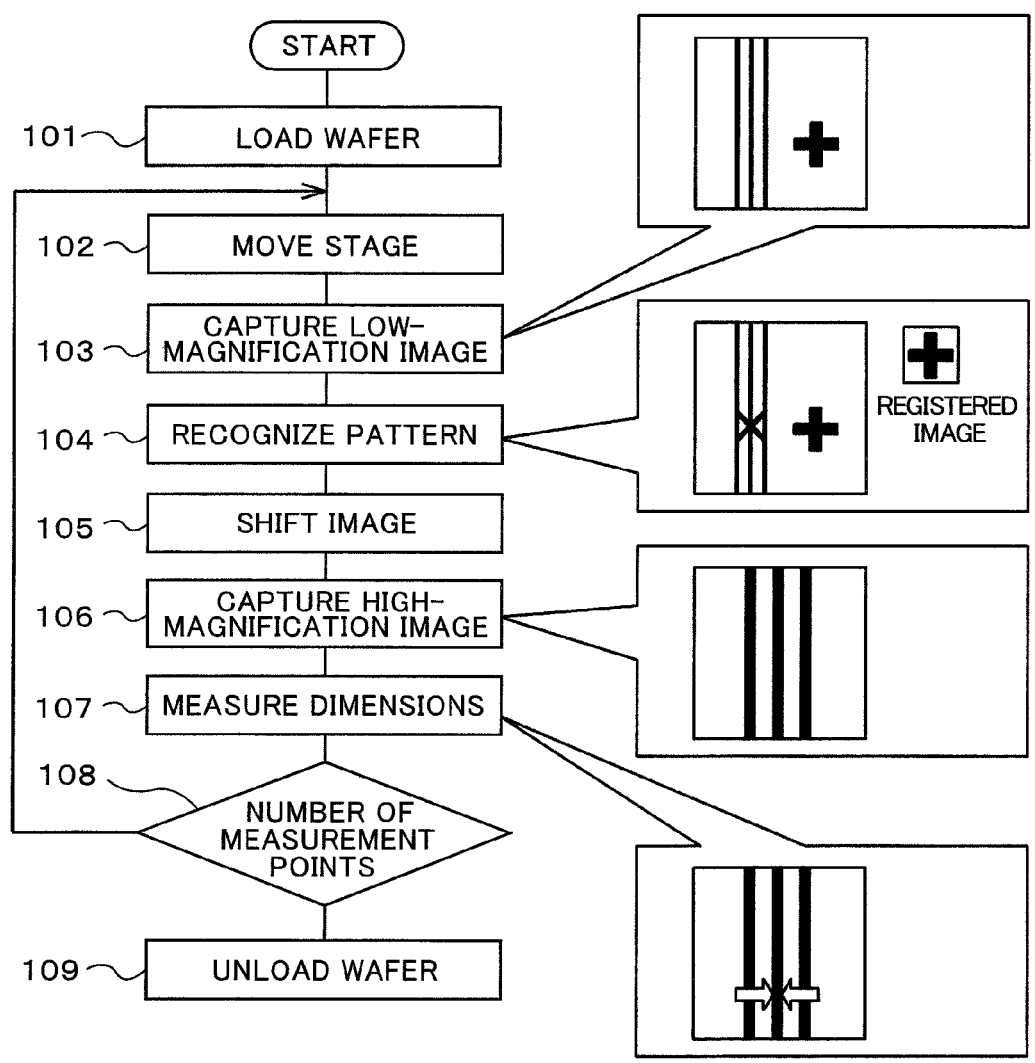
FIG. 4 is an explanatory diagram of prior art.
Figure 5A:
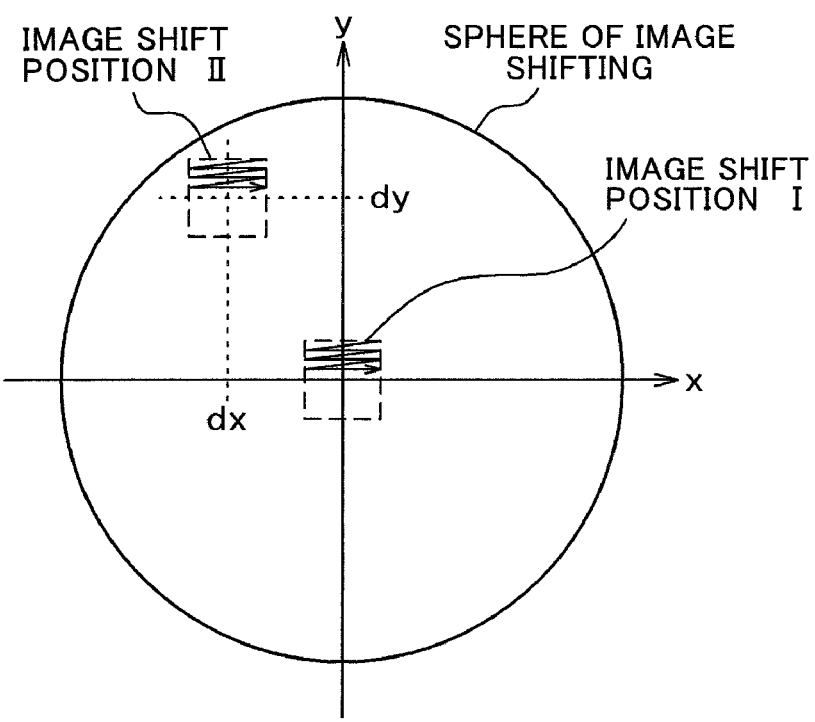
FIG. 5 is an explanatory diagram of the first embodiment of the present invention.
Figure 5B:
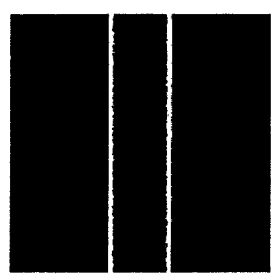
Figure 5B:
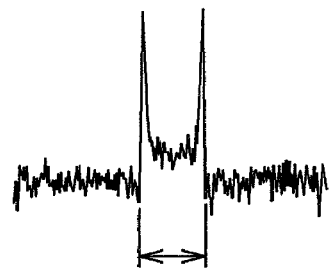
Figure 5C:
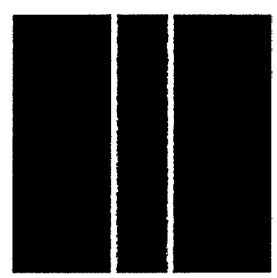
Figure 5C:
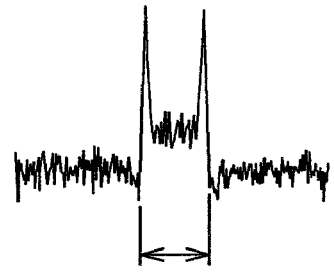

FIG. 1 illustrates a flow of dimension measurement in a charged particle beam device pertaining to the present invention. The steps of loading a wafer (step 101), moving the stage (step 102), capturing an image at a low magnification (step 103), pattern recognition (step 104), image shift (step 105), and capturing an image at a high magnification (step 106) are as described in the Background Art section.

In the present invention, a position of image shift (dx, dy) when capturing an image at a high magnification is stored (step 301), reference is made to a lookup table having a correlation between an image shift position and an image or profile correction coefficient stored therein (step 302), and a image or profile correction is performed (step 303). Then, dimension measurement is performed using the corrected image or profile (step 107).

Figure 6:
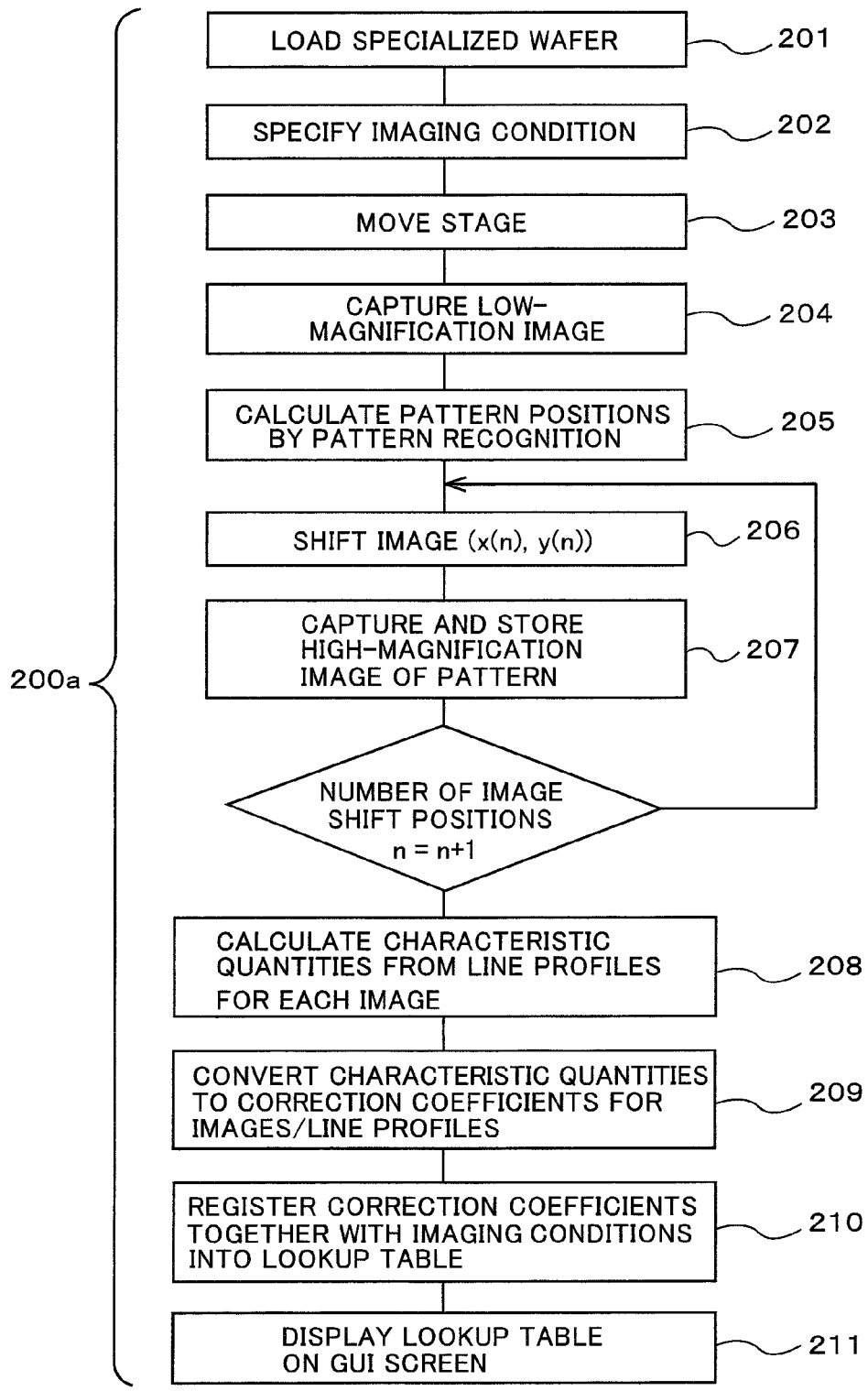
FIG. 6 is a flowchart to explain the first embodiment of the present invention.

How to create the lookup table used in step 302 and how to make correction in step 303 are detailed below. FIG. 6 illustrates a flow of creating the lookup table used in step 302. What are described in the lookup table are correlations between image shift positions based on actual measurements with regard to image shift vs. beam diameter variance measured using a specialized wafer and image or profile correction coefficients.

Figure 7A:
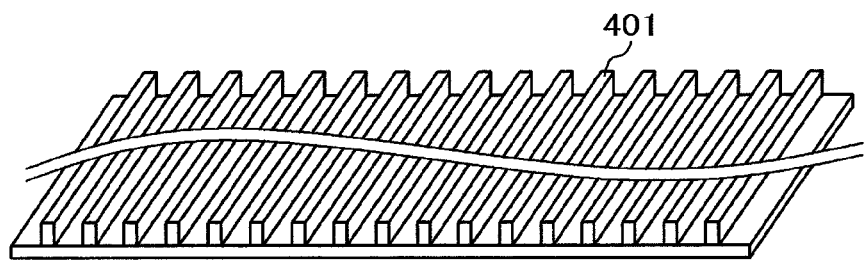
FIG. 7 is an explanatory diagram of the first embodiment of the present invention.
Figure 7B:
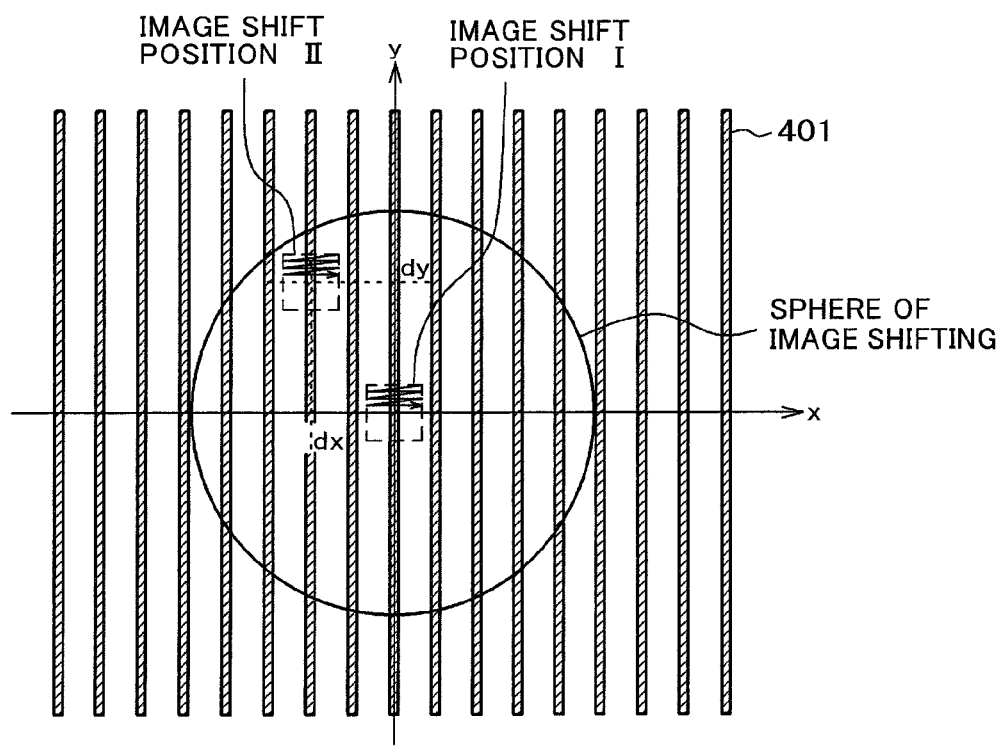

As the specialized wafer, a wafer having patterns like a series of uniform cross-section shapes, as shown in FIG. 7($a$) is suitable. As shown in FIG. 7($b$), an image is captured without an image shift (image shift position I) and an image is captured after an image shift ((image shift position II). By quantifying a difference in the gradient of a line profile between these images (a method for this will be described later), a difference in the beam diameter is obtained.

At this time, if the cross-section shape of a pattern differs at the image shift positions I and II, the result of the quantification as above should include a factor of a difference in the patterns' cross-section shapes, besides the difference in the beam diameter. Therefore, it is desirable that the cross-section shapes of patterns are uniform, especially, for a taper angle.

Figure 8A:
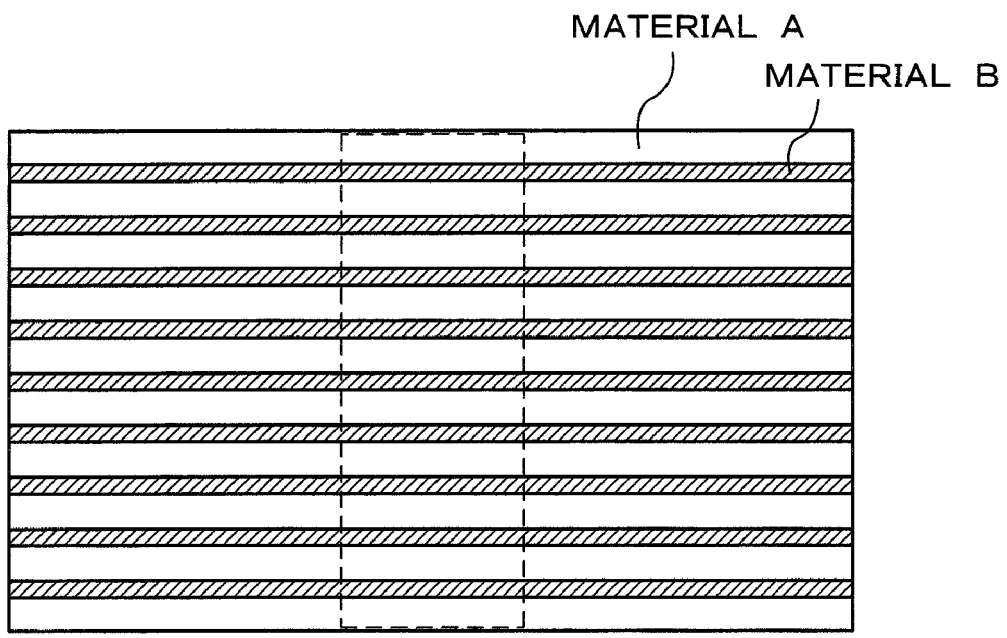
FIG. 8 is an explanatory diagram of the first embodiment of the present invention.
Figure 8B:
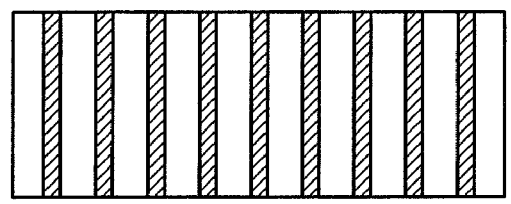
Figure 8C:
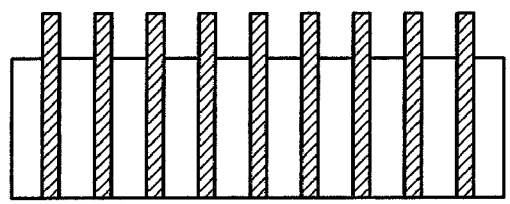

When patterns are formed by an ordinary lithography process, it is inevitable that line edge roughness occurs. Hence, suitable are patterns formed by a method including, for example, depositing a material A and a material B alternately, as shown in FIG. 8($a$), dicing it (FIG. 8($b$)), selectively etching the material A only (FIG. 8($c$)), and mounting it on a wafer.

The patterns formed by this method have a little line edge roughness and, moreover, the edges of the patterns have a constant (perpendicular) taper angle anywhere. Alternatively, patterns with an equal taper angle may be formed by using a single crystal wafer and performing selective etching following a crystal face. For a Si wafer, the use of a wafer whose front surface is a 110-oriented face enables forming patterns having perpendicular tapers.

Figure 9:
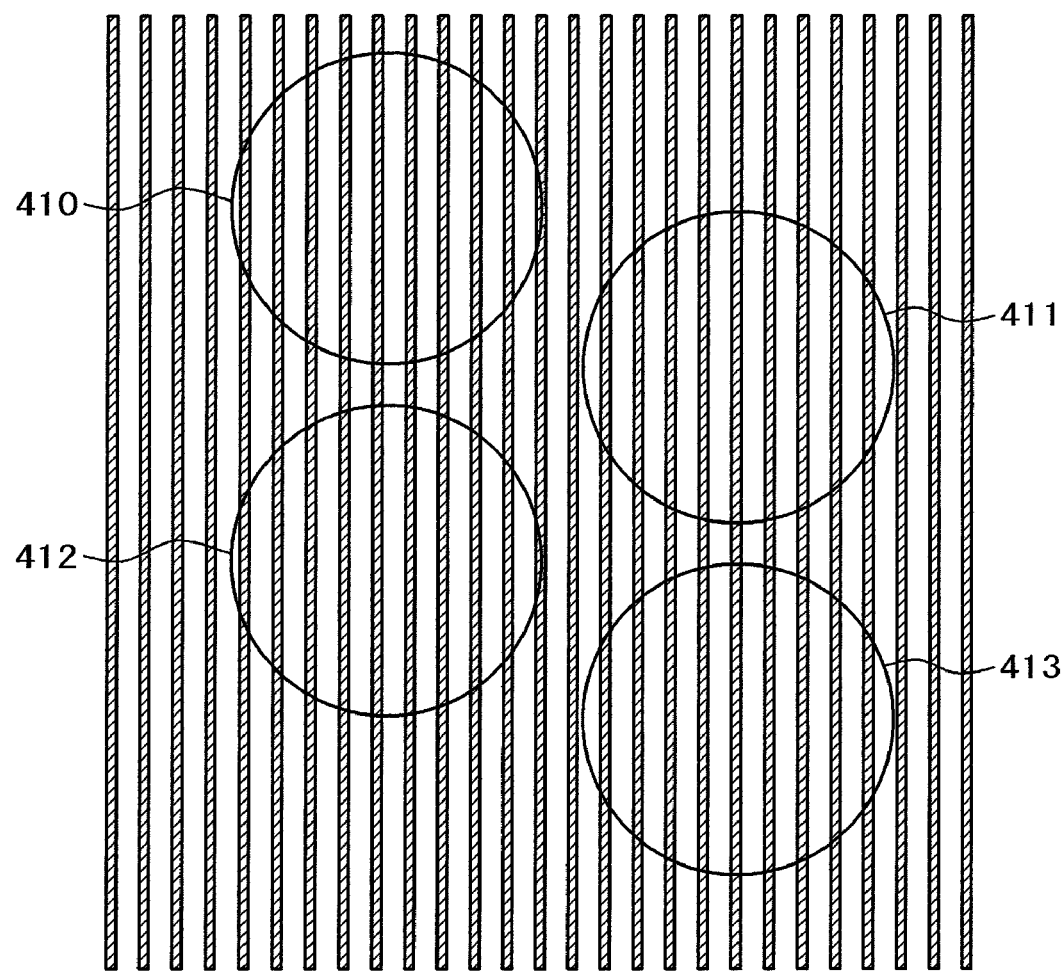
FIG. 9 is an explanatory diagram of the first embodiment of the present invention.

In order to eliminate the influence of a difference in the cross-section shapes of patterns more strictly, shifting the positions to be used across the patterns and capturing images at a number of positions are performed, and using an average of results of quantification obtained at each position is effective. For example, FIG. 9 illustrates a case where four positions (410 to 413) across the patterns are used. Because contamination remains at a position where an image has once been captured, it is needed that the positions to be used do not overlap with each other as shown in FIG. 9.

Returning to FIG. 6, the flow of creating the lookup table is described. A specialized wafer as above is loaded (step 201), and imaging conditions such as an acceleration voltage and a beam divergence angle are specified (step 202). The stage is moved to an image capturing position (step 203), an image is captured at a low magnification (step 204), an arrangement of line patterns is obtained by pattern recognition and N image shift positions are calculated (step 205).

For example, if images are captured at ±3 image shift positions in a horizontal direction and ±3 image shift positions in a vertical direction, N is 49 (7 horizontally×7 vertically). Based on the result of the calculation, an image shift is performed (step 206) and an image is captured at a high magnification (step 207) repeatedly. After capturing all the images required, characteristic quantities are calculated from line profiles for each image (step 208).

Figure 10A:
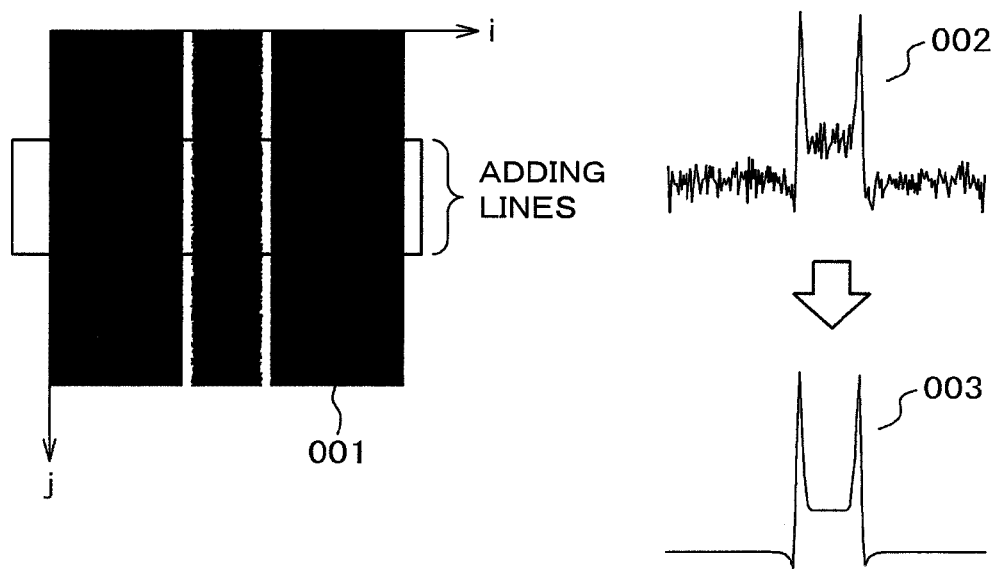
FIG. 10 is a flowchart to explain a second embodiment of the present invention.
Figure 10B:
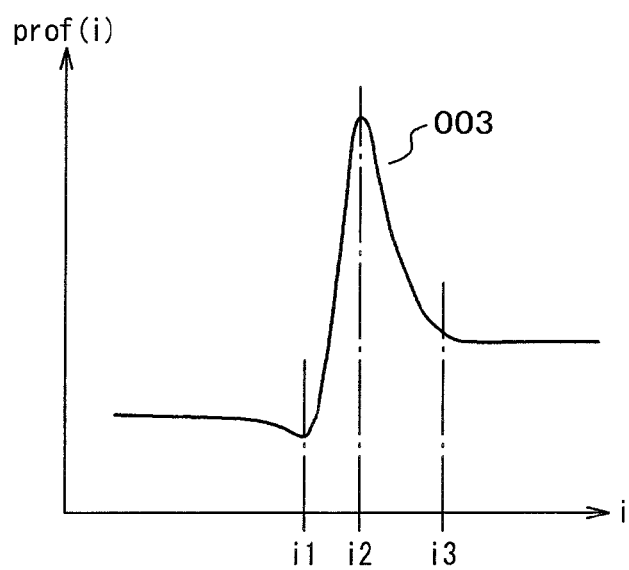

A method of calculating characteristic quantities is described using FIG. 10. A line profile 002 is a cross-sectional waveform of an electron beam image 001. Lines are added in a direction j to reduce noise and a line profile 003 in which noise has been reduced sufficiently is obtained after adding N lines. FIG. 10($b$) is an enlarged view of a left white band (WB) portion of the line profile 003.

Between the beam diameter and the line profile gradient, there is a relationship that the smaller the line beam, the lager will be the line profile gradient. Thus, possible characteristic quantity parameters are (a) an average gradient between i1 and i2 and (b) a maximum gradient between i1 and i2. Alternatively, since a change in the gradient in the WB portion results in a change in the WE width, (c) a WB width (i3-i1) and (d) an outer WB width (i2-i1) may be used as such parameters. In the case of (c) ad (d), the smaller the beam diameter, the smaller will be the characteristic quantity value, inversely to (a) and (b).

At the next step 209 in FIG. 6, the characteristic quantities calculated for each image are converted to correction coefficients which are used in step 303 in FIG. 1. For this purpose, to begin with, by comparing N characteristic quantities, checking for a position for which the beam diameter is maximum in the image shift range is done. That is, this may be finding an image shift position associated with a minimum characteristic quantity, if the characteristic quantity parameter (a) or (b) is used, or finding an image shift position associated with a maximum characteristic quantity, if the characteristic quantity parameter (c) or (d) is used.

Figure 11A:
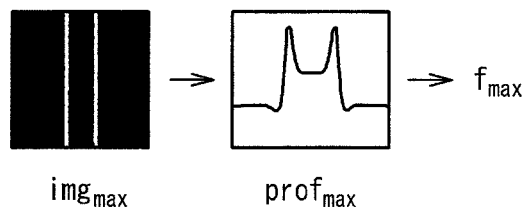
FIG. 11 is an explanatory diagram of the first embodiment of the present invention.
Figure 11B:
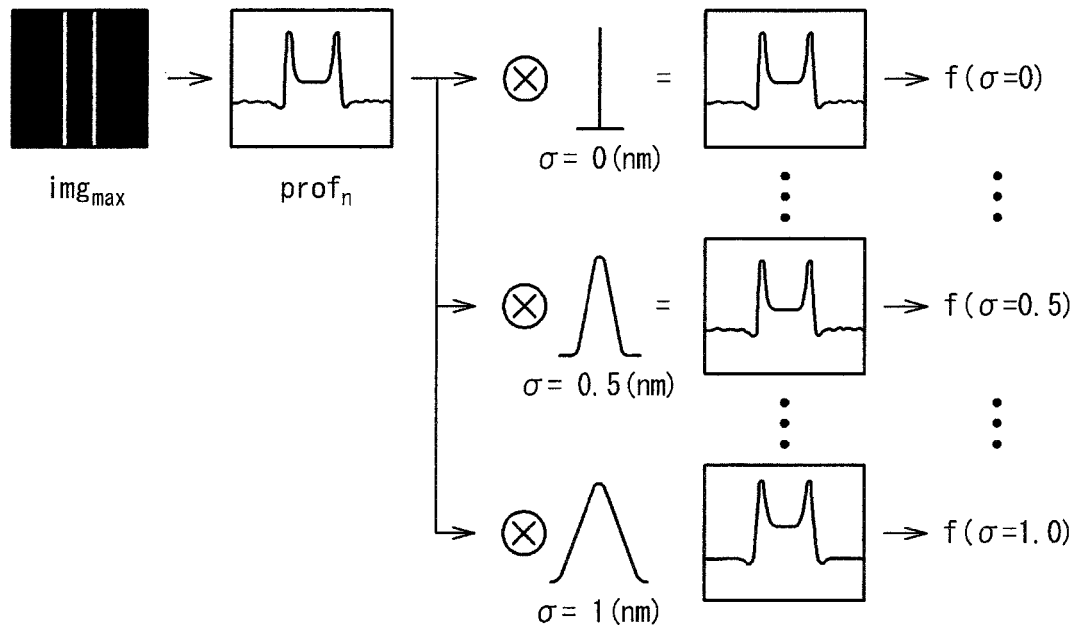
Figure 11C:
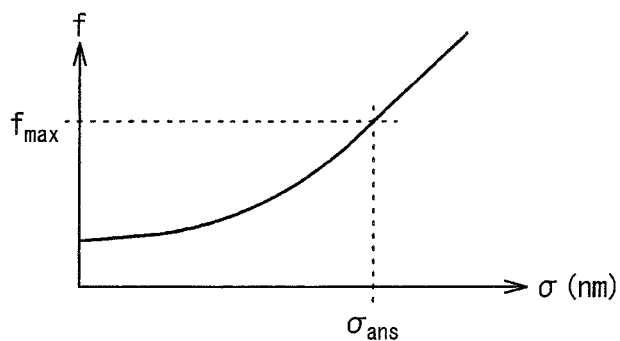

A concrete method of calculating correction coefficients is illustrated in FIG. 11. As in FIG. 11($a$), $f_{max}$ represents a characteristic quantity calculated from a line profile $prof_{max}$ of an image $img_{max}$ captured at an image shift position for which the beam diameter becomes maximum. For a line profile $prof_n$ of an image $img_n$ captured at each image shift position, the method evaluates a Gauss function with varying values of σ, i.e., convolutional characteristic quantities. Since a larger value of corresponds to a larger beam diameter, as the value of σ increases, the value of the parameter (a) or (b) decreases or the value of the parameter (c) or (d) increases.

FIG. 11($c$) represents a relationship between possible values of σ and characteristic quantities, when the characteristic quantity parameter (c) or (d) is used. A correction coefficient associated with an image shift position at which an image $img_n$ was captured is determined to be a value of $\sigma_{ans}$ (in units of nm). A value of the correction coefficient thus determined becomes 0 (nm) at a position for which the beam diameter is maximum and becomes larger at a position for which the beam diameter becomes smaller.

The above procedure, in other words, first measures a profile $prof_n$ at a given shift image position. For this profile $prof_n$, case-by-case characteristic quantities f are calculated by convolving various correction quantities σ. FIG. 11($c$) indicates a relationship as to how the characteristic quantity changes, as the correction quantity 6 changes, at a given position. In FIG. 11($c$), a correction quantity $\sigma_{ans}$ related to a characteristic quantity corresponding to the characteristic quantity fmax at the position for which the beam diameter becomes maximum, determined beforehand, is the correction quantity at the given position. That is, the graph of FIG. 11($c$) needs to be created for all measurement positions.

Regarding a beam intensity distribution as a Gauss function, this correction coefficient is none other than a square root of the difference between the square of a beam diameter $bw_n$ associated with a position at which an image $img_n$ was captured and the square of a beam diameter $bw_{max}$ associated with a position at which an image $img_{max}$ was captured $(bw_{max}^2 - bw_n^2)^{1/2}$. It is a function of $bw_{max}$ and $bw_n$ only and this value does not change even if any of the characteristic quantity parameters (a) to (4) is used or independent of the wafer used.

Figures 12A, 12B:
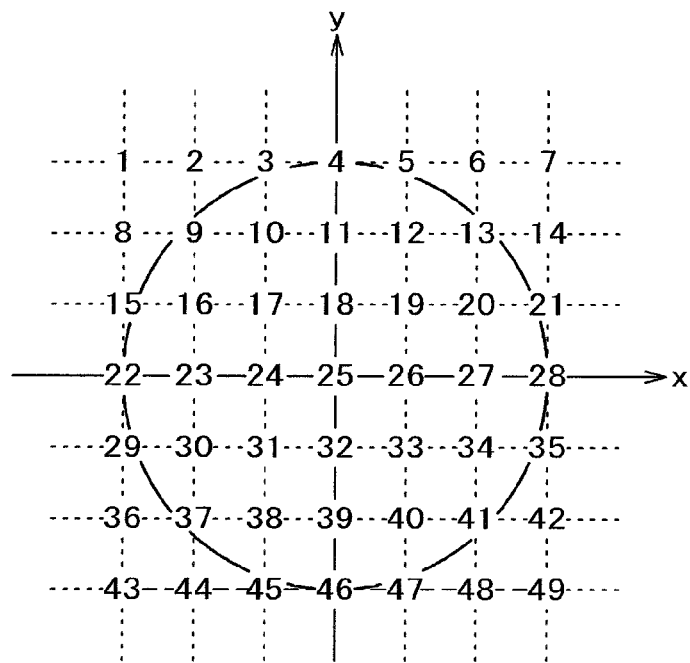
FIG. 12 is an explanatory diagram of the first embodiment of the present invention.

At the next step 210 in FIG. 6, the correction coefficients for all image shift positions are registered together with the imaging conditions as a lookup table. The structure of such lookup table is illustrated in FIG. 12. In this example, the correction coefficients associated with the image shift positions (at the intersections of dotted lines in FIG. 12($a$)) spaced ±6 microns in both vertical and horizontal directions in an area of ±18 microns are registered. The tendency of beam diameter variance due to image shift differs depending on the imaging conditions such as an acceleration voltage and a beam divergence angle and, therefore, lookup tables are created and registered for each imaging condition.

Figures 13A, 13B:
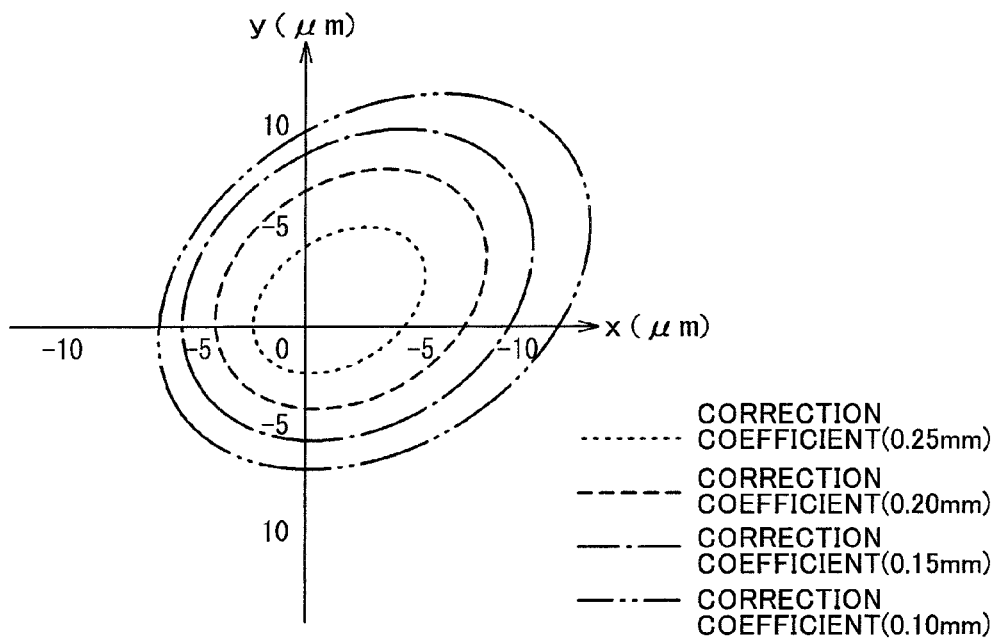
FIG. 13 is an explanatory diagram of the first embodiment of the present invention.

The charged particle beam device pertaining to the present invention has a function of display the lookup tables (step 211 in FIG. 6). From a list of the lookup tables which have been registered at that point, when a user selects a desired lookup table (FIG. 13($a$)), a relationship between image shift positions and correction coefficients is displayed (FIG. 13($b$)). In the table of FIG. 13($a$), the acceleration voltage refers to an anode voltage of the electron microscope and the mode refers to a convergence mode of the electron beam. That is, mode H is a high resolution mode and L is a low resolution mode.

FIG. 13($b$) represents the relationship between image shift positions and correction coefficients, using contour lines. The display of a lookup table can also be used to judge whether a readjustment of the optics is required, in addition to checking the contents of the lookup table. More specifically, if a correction coefficient exceeds a predetermined value in a given image shift area, it is judged that an adjustment of the optics is required. Alternatively, as in FIG. 13($b$), if the image shift zero point does not match the position of the minimum beam diameter, the coordinate system for the beam deflector may be shifted.

Then, descriptions are provided for image or file correction which is performed at step 303 in FIG. 1. Reference is made to a lookup table (step 202) suitable for an image shift position (dx, dy) stored at step 301. Because the correction coefficients associated with discrete image shift positions are registered into a lookup table, as in FIG. 12, a correction coefficient for the position (dx, dy) is obtained by interpolating the correction coefficients for four neighboring image shift positions.

Figure 14A:
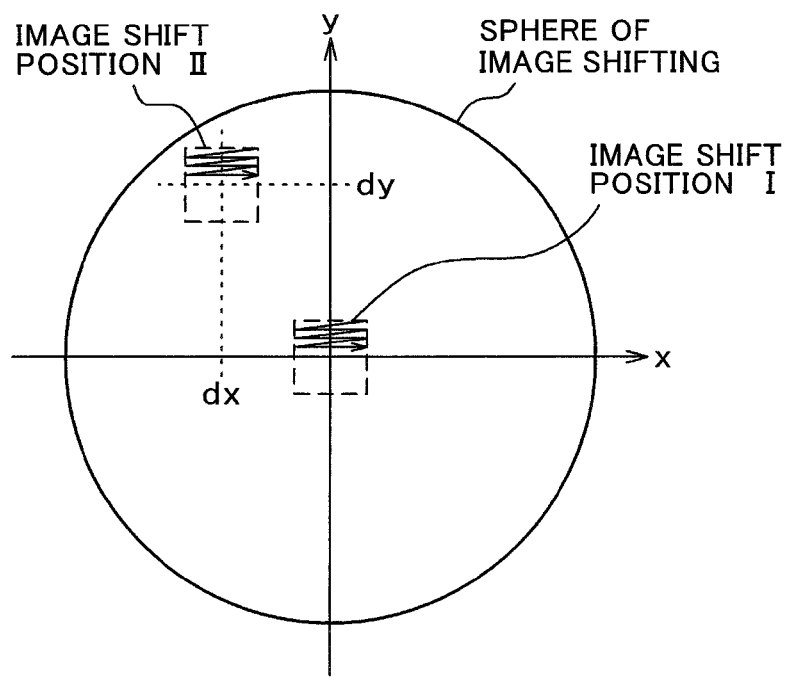
FIG. 14 is a flowchart to explain the first embodiment of the present invention.
Figure 14B:
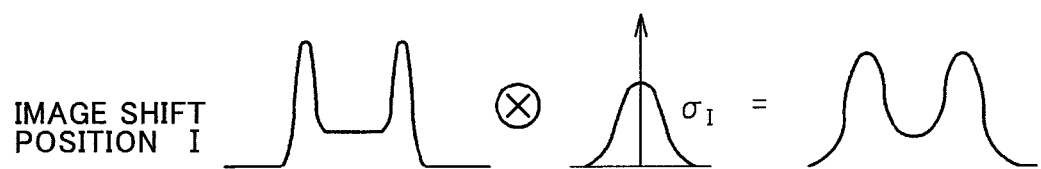
Figure 14B:
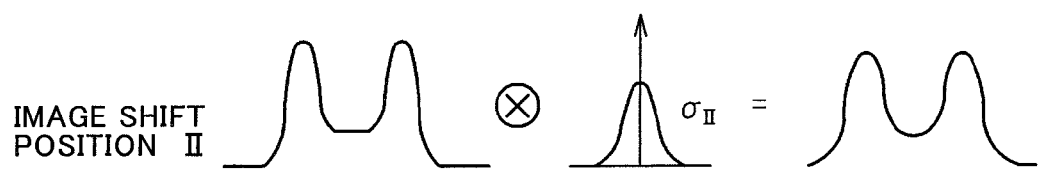

A profile correction method is illustrated in FIG. 14. Profile correction is implemented by convolving a Gauss function of a value of σ related to each image shift position registered into the lookup table, as shown in FIG. 14(*b*).

In FIG. 14(*a*), if the beam diameter at the image shift position I is larger than the beam diameter at the image shift position II, the line profile for II before correction is relatively rounded and the dimension value measured at II is larger than the dimension value measured at I. By making corrections by convolving a Gauss function with smaller values of σ for II and with larger values of σ for I, the line profiles for both become identical and, thus, the dimension values measured become equal. After generating line profiles once, convolving a Gauss function may be performed for the line files as above or line profiles may be generated after convolving a Gauss function for images.

According to the present invention, dimension measurement results are equalized independent of image shift positions. Therefore, varying measured dimension values attributed to a stage stop position error, which was a problem for conventional CD SEMs, is improved and measurement reproducibility is enhanced.

Embodiment 2

Figures 15A, 15B:
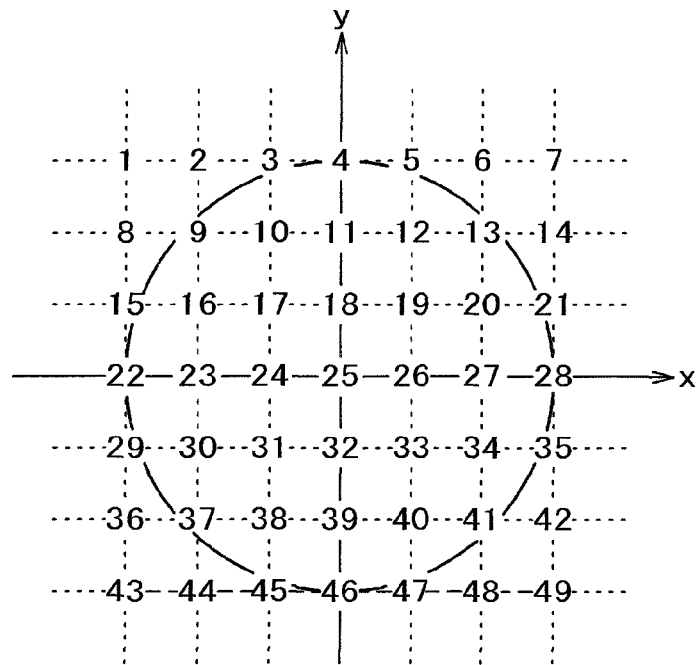
FIG. 15 is an explanatory diagram of the second embodiment of the present invention.

While the first embodiment features evaluating correction coefficients for profile or image correction, amounts of change for dimension values measured at each image shift position may be determined beforehand and results may be registered into a lookup table. The structure of such a lookup table is shown in FIG. 15. Offset values to adjust dimension measurement results are described in the lookup table.

Lookup tables in the foregoing first embodiment are registered for each imaging condition. However, lookup tables need to be registered for each imaging condition (acceleration voltage, beam divergence angle, etc.) and for each pattern to be measured, because the amounts of change for dimension measurement values differ depending on the pattern to be measured. In a case that the number of types of patterns to be measured is small, this embodiment is beneficial.

Embodiment 3

While, in the first embodiment, a relationship between image shift positions and varying beam diameters is obtained by actual measurement in the flow shown in FIG. 6, beam diameters at all image shift positions may be calculated by a SEM optics simulator and results may be converted to correction coefficients which then may be registered into a lookup table.

More specifically, in this embodiment, given that the beam diameter at a given image shift position is $bw_n$ in terms of a Gauss function and the maximum beam diameter in the sphere of image shifting is $bw_{max}$ in terms of a Gauss function, a correction coefficient $\sigma_n$ associated with each image shift position is calculated by $\sigma_n = (bw_{max}^2 - bw_n^2)^{1/2}$. Results of this calculation are registered into a lookup table as shown in FIG. 12, as is the case for the first embodiment, and profile or image correction is performed by the method illustrated in FIG. 14(*b*), as is the case for the first embodiment.

Embodiment 4

In the first embodiment, a relationship between image shift positions and varying beam diameters is obtained by using vertical line patterns and values of σ of a one-dimensional Gauss function are used as correction coefficients. This embodiment makes use of line patterns extending in three directions, i.e., vertical, horizontal, and diagonal (for example, π/4=45°), as shown in FIG. 16, and a two-dimensional Gauss function that is represented by three parameters: a long diameter a as a value of σ, a short diameter b as a value of σ, and a angle θ, as shown in FIG. 17(*a*).

Figure 16A:
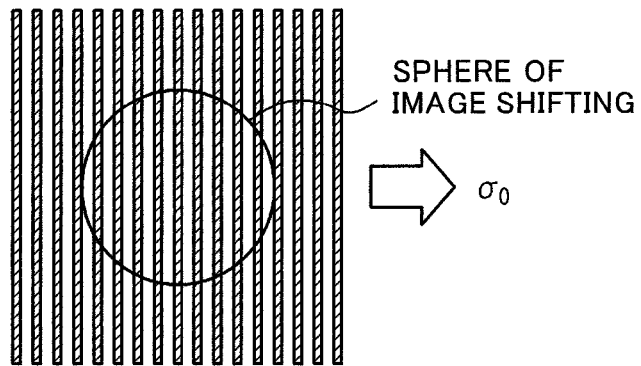
FIG. 16 is an explanatory diagram of a fourth embodiment of the present invention.
Figure 16B:
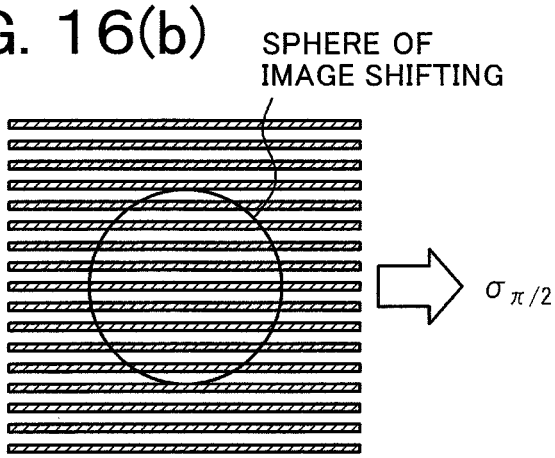
Figure 16C:
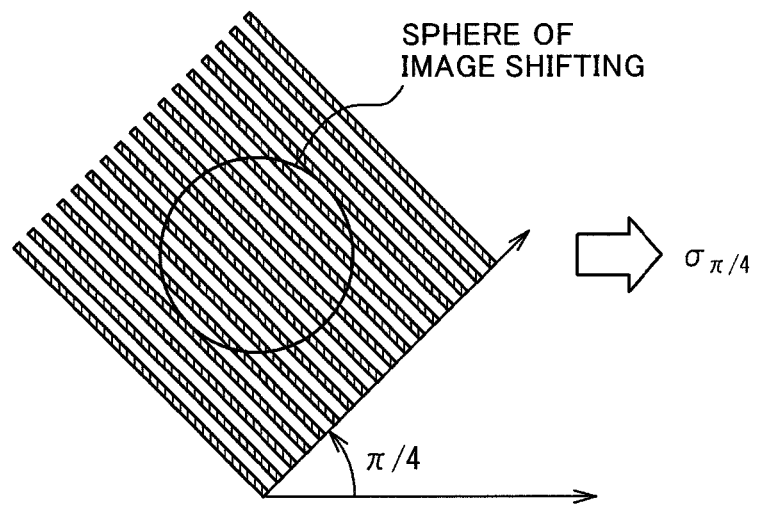

These a, b, and θ are evaluated as follows:

(1) The flow shown in FIG. 6 is performed for each of the vertical, horizontal, and diagonal patterns and correction coefficients $\sigma_0$, $\sigma_{\pi/2}$, and $\sigma_{\pi/4}$ are evaluated for each (see FIG. 16).

Figures 17A, 17B, 17C:
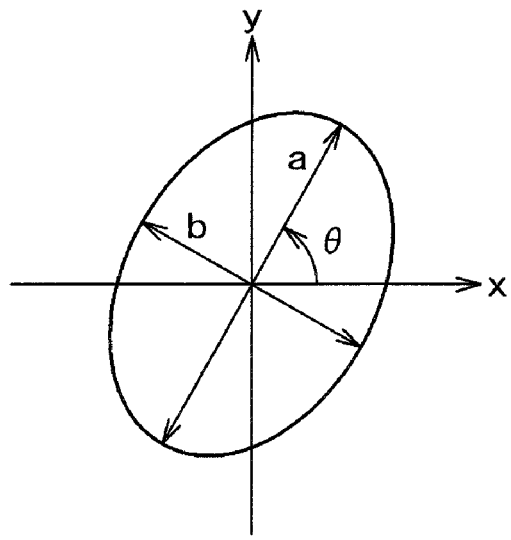
FIG. 17 is an explanatory diagram of the fourth embodiment of the present invention.

(2) By solving simultaneous equations in FIG. 17(*b*), unknowns a, b, and θ are evaluated. π/2 in a second equation is the direction of a horizontal pattern and π/4 in a third equation is the direction of a diagonal pattern. Although it is hard to solve the simultaneous equations analytically, a, b, and θ are evaluated uniquely, if numerical calculation is executed.

While one correction coefficient is registered per image shift in a lookup table used in the first embodiment (see FIG. 12), three correction coefficients of a, b, and θ are registered in this embodiment.

The correction process in step 303 in FIG. 1 is implemented by (1) convolving a two-dimensional Gauss function that is represented by a, b, and θ for an image or (2) convolving a one-dimensional Gauss function having a value of σ calculated, as in FIG. 17(*c*), for a line profile, depending on its direction φ.

According to this embodiment, it becomes possible to cope with a case where beam diameter variance due to image shifting is not isotropic, for example, the tendency of beam diameter variance differs between horizontal and vertical directions. If vertical line patterns are to be measured, the first embodiment is applied without a problem. However, if hole patterns are to be measured or a wafer having a mixture of patterns extending in various directions is to be measured, this embodiment is beneficial.

Embodiment 5

Figure 18:
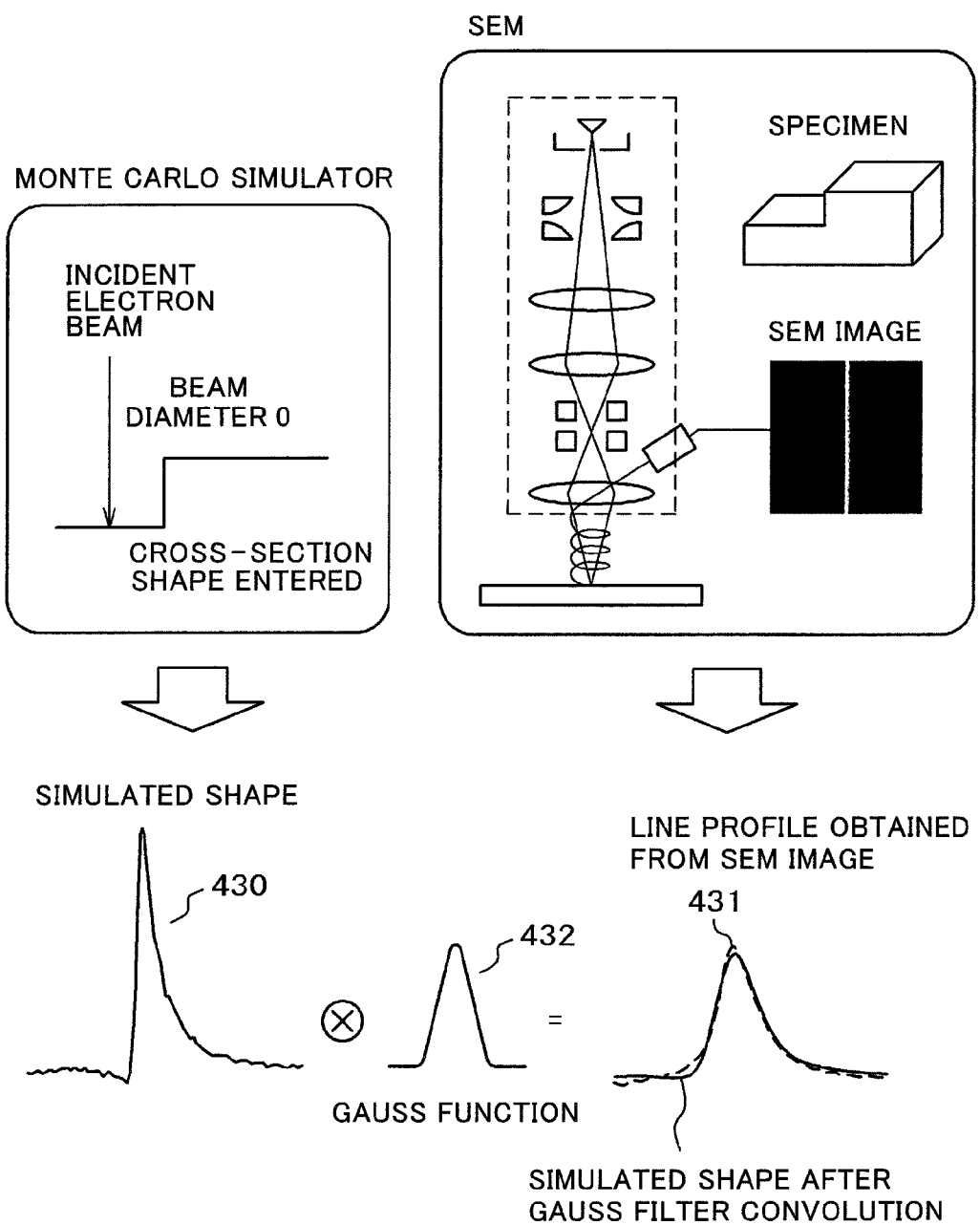
FIG. 18 is an explanatory diagram of a fifth embodiment of the present invention.

While, in the first embodiment, correction coefficients are obtained by quantifying a change in the gradient of a line profile resulting from beam diameter variance, the present embodiment obtains correction coefficients by a method illustrated in FIG. 18.

In this embodiment, a secondary electron signal waveform 430 when the beam diameter is 0 is obtained using a Monte Carlo simulation. Based on this waveform and a line profile 431 obtained from a real SEM image, a value of σ of a Gauss function is evaluated that is most matches the profile 431 when convolving a Gauss function 432 in the waveform 430.

Given that a value of σ of a Gauss function obtained as above at an image shift position n is $S_n$ and a maximum value of σ in the sphere of image shifting is $S_{max}$, a correction coefficient $\sigma_n$ associated with each image shift position is calculated by $\sigma_n = (S_{max}^2 - S_n^2)^{1/2}$. Results of this calculation are registered into a lookup table as shown in FIG. 12, as is the case for the first embodiment, and profile or image correction is performed by the method illustrated in FIG. 14(*b*), as is the case for the first embodiment.

Figure 19:
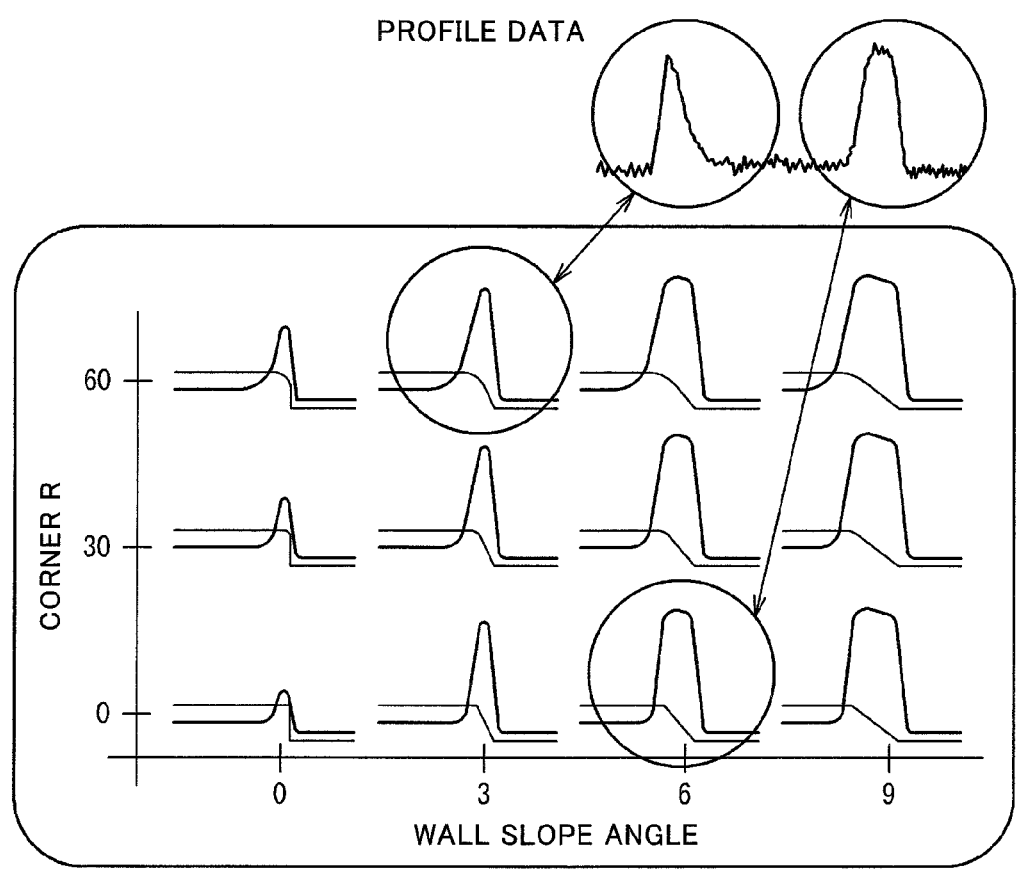
FIG. 19 is an explanatory diagram of the fifth embodiment of the present invention.

Alternatively, instead of obtaining correction coefficients, regarding the above $S_n$ as the beam diameter at each image shift position, a method of non-patent document (J. S. Villarrubia, A. E. Vladar, J. R. Lowney, and M. T. Postek, "Scanning electron microscope analog of scatterometry," Proc. SPIE 4689, pp. 304-312 (2002) illustrated in FIG. 19 may be used. The method of FIG. 19 estimates the corner R and slope of a level difference portion, using a library created beforehand based on beam profiles.

Application of this to this embodiment is implemented by creating a library of beam profiles and amounts of correction for each image shift position and determining an amount of correction by referring to the library.

Embodiment 6

Figure 20A:
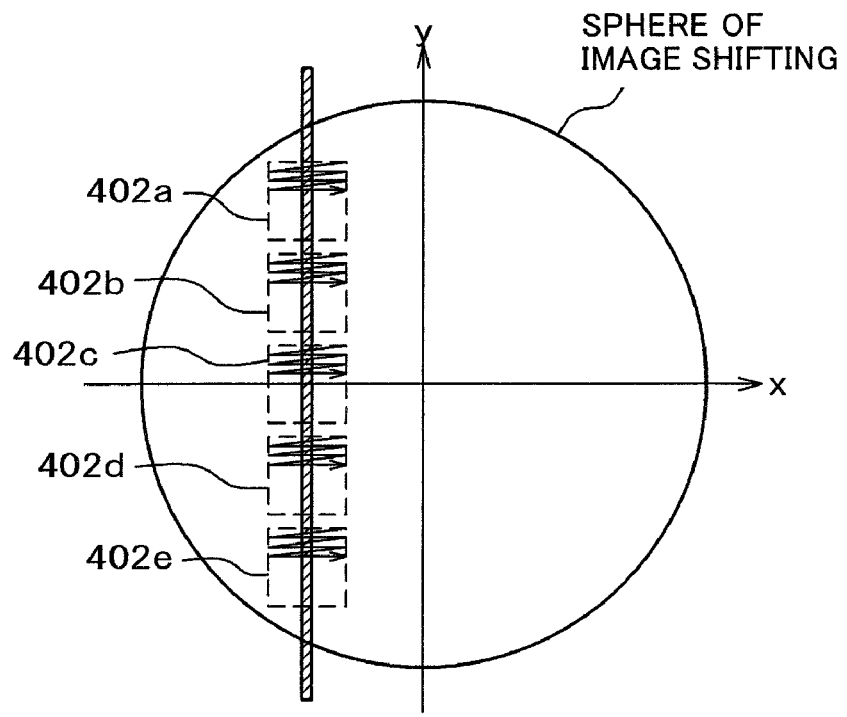
FIG. 20 is a flowchart to explain a sixth embodiment of the present invention.
Figure 20B:
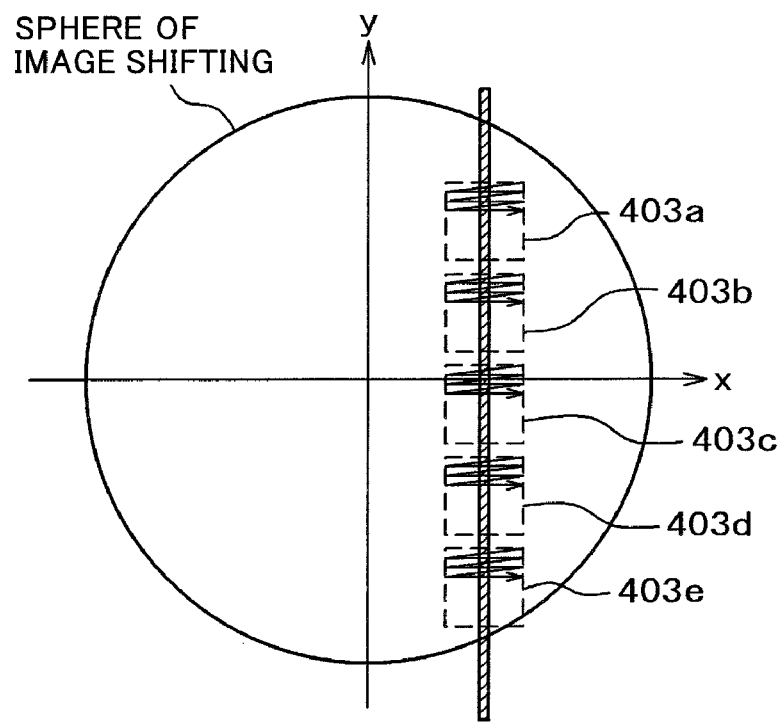
Figure 21:
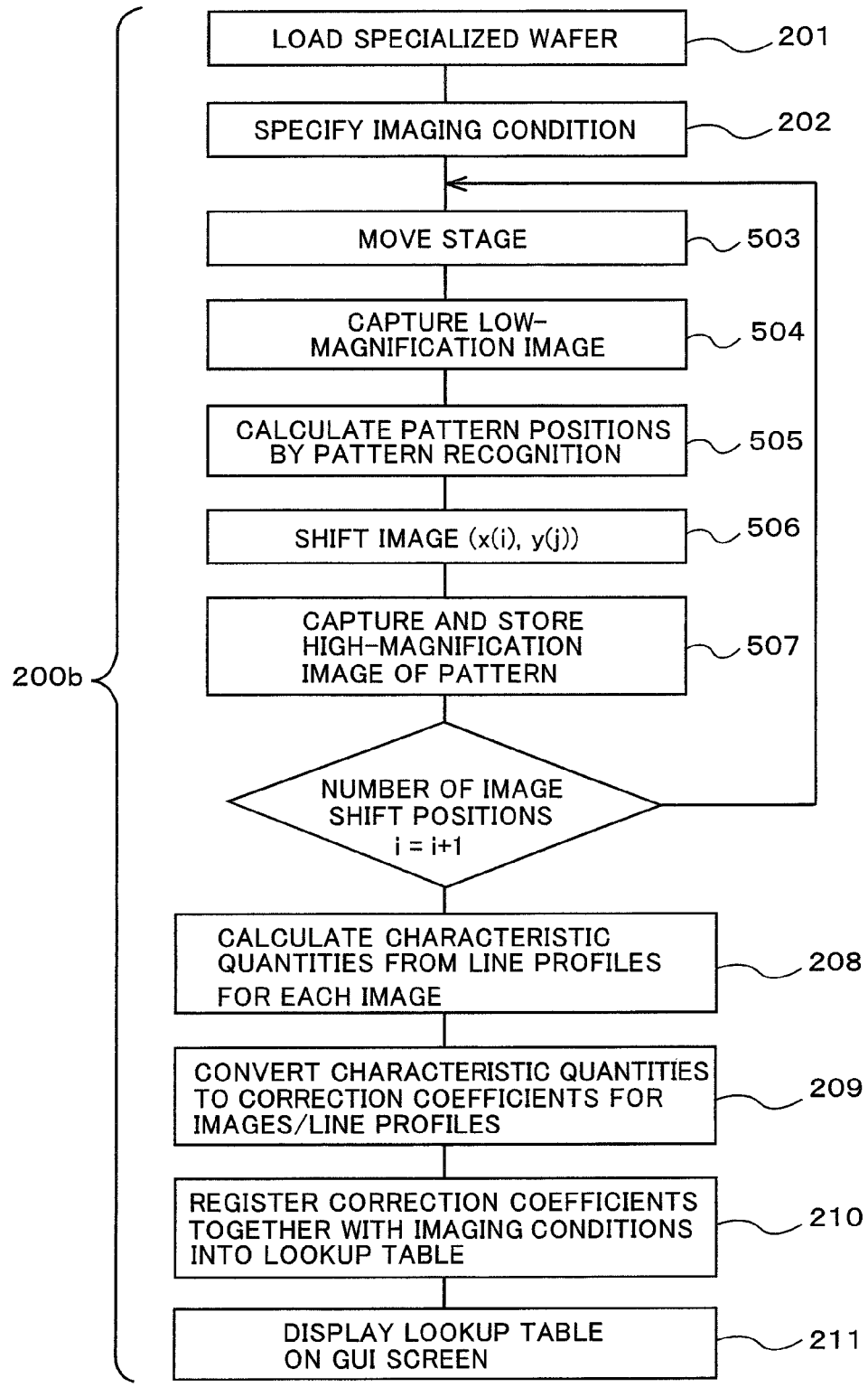
FIG. 21 is a diagram illustrating a processing flow of the sixth embodiment of the present invention.

While the first embodiment makes use of a series of line patterns as shown in FIG. 7, this embodiment makes use of the edges of one pattern and captures images at diverse image shift positions by repeating moving the stage→capturing images at a plurality of points across the edges of one pattern (FIG. 20(a))→moving the stage→capturing images at a plurality of points across the edges of one pattern (FIG. 20(b))→ . . . . The overall flow is illustrated in FIG. 21. The flow of FIG. 21 is the same as the flow described in FIG. 6, except that the stage is moved whenever measuring the edges of one pattern.

Figure 22A:
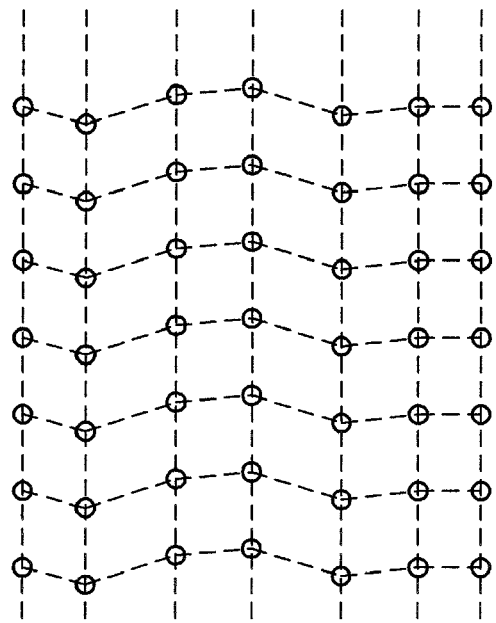
FIG. 22 is an explanatory diagram of the sixth embodiment of the present invention.
Figure 22B:
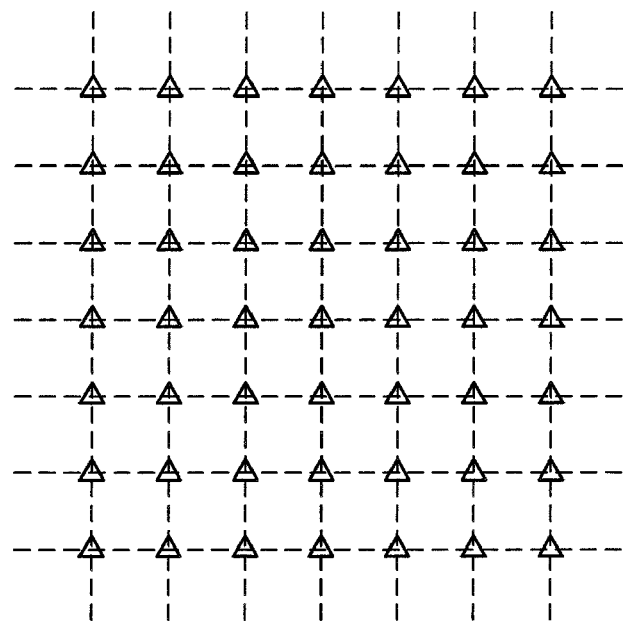

Because the stage stop position varies within a certain level of accuracy, a data set obtained is not those spaced at even pitches in the sphere of image shifting as in the first embodiment, but becomes data spaced at uneven pitches as indicated by circle marks in FIG. 22(a). After it is converted to data spaced at even pitches as shown in FIG. 22(b) by interpolation/extrapolation processing on neighboring data, the data set is registered into a lookup table. The way of using the thus registered lookup tables is the same as in the first embodiment.

Position-dependent difference in the cross-section shape of a pattern becomes an error factor when obtaining a relationship between image shift positions and beam diameters, as mentioned in the description of the first embodiment. This embodiment has a demerit in which time taken to create lookup tables increases because stage movement is involved, whereas it has a merit in which the above error factor is reduced.

Embodiment 7

While the first through sixth embodiments cope with position-dependent difference in dimension values measured at image shift positions, this embodiment copes with tool to tool matching, that is, difference between dimension values measured by respective devices.

Figure 23:
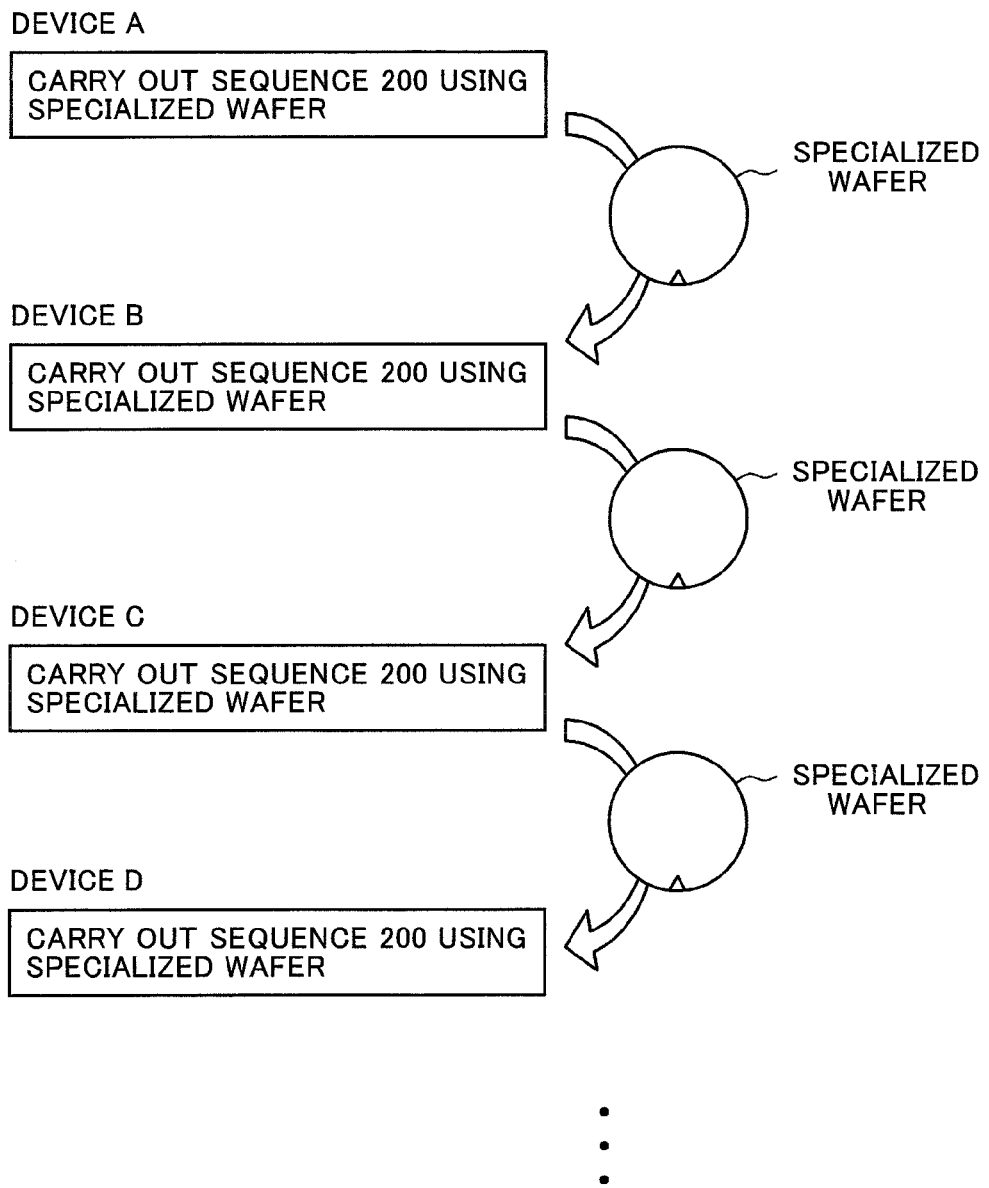
FIG. 23 is an explanatory diagram of a seventh embodiment of the present invention.

As shown in FIG. 23, after carrying out the sequence 200 illustrated in FIG. 6 or FIG. 21 with respective devices using one specialized wafer, a maximum beam diameter among all image shift positions on all the devices is found and correction coefficients are set so that line profiles obtained at all image shift positions on all the devices become equal to it.

According to this embodiment, it is possible to equalize dimension values measured at all image shift positions on all the devices.

EXPLANATION OF REFERENCE NUMERALS

001 . . . Electron beam image, 002 . . . Line profile, 003 . . . Line profile after adding N lines, 010 . . . Electron gun, 011 . . . Convergence lens, 012 . . . Deflector, 013 . . . Objective lens, 014 . . . Detector, 015 . . . Control unit, 020 . . . Specimen

The invention claimed is:

1. A charged particle beam device that scans a specimen with a primary charged particle beam converged on the specimen and measures dimensions of patterns on the specimen using line profiles obtained by detecting secondary charged particles emitted from the specimen, the charged particle beam device comprising:
   means for creating and holding a lookup table associating image shift positions with varying beam diameters of the primary charged particle beam;
   means for storing the image shift positions when obtaining the line profiles;
   means for calculating varying beam diameters when obtaining the line profiles by fitting the stored image shift positions in the lookup table; and
   means for reflecting the calculated varying beam diameters to dimension measurement processing.

2. The charged particle beam device according to claim 1, wherein the lookup table is linked with an imaging condition.

3. The charged particle beam device according to claim 1, wherein the means for creating and holding a model associating the image shift positions with the varying beam diameters of the primary charged particle beam includes:
   obtaining line profiles of a specimen having step edges at diverse image shift positions; and associating a characteristic quantity resulting from quantifying the steepness of a waveform gradient in a portion of the each line profile, corresponding to the edges of the specimen on the line profiles, with the each image shift position.

4. The charged particle beam device according to claim 1, wherein the varying beam diameters are represented by a two-dimensional Gauss function.

5. The charged particle beam device according to claim 1, wherein the means for reflecting the varying beam diameters to dimension measurement processing is implemented by convolving a Gauss function to compensate for the varying beam diameters in order to correct the line profiles.

6. A charged particle beam device that scans a specimen with a primary charged particle beam converged on the specimen and measures dimensions of patterns on the specimen using line profiles obtained by detecting secondary charged particles emitted from the specimen, the charged particle beam device comprising:
   means for creating and holding a lookup table associating image shift positions with varying beam diameters of the primary charged particle beam; and
   means for judging whether a relationship between the image shift positions and the varying beam diameters of the primary charged particle beam satisfies a predefined condition by referring to the lookup table.

7. The charged particle beam device according to claim 6, wherein the lookup table is linked with an imaging condition.

8. The charged particle beam device according to claim 6, wherein the means for creating and holding a model associating the image shift positions with the varying beam diameters of the primary charged particle beam includes:
   obtaining line profiles of a specimen having step edges at diverse image shift positions; and associating a characteristic quantity resulting from quantifying the steepness of a waveform gradient in a portion of the each line profile, corresponding to the edges of the specimen on the line profiles, with the each image shift position.

9. The charged particle beam device according to claim 6, wherein the varying beam diameters are represented by a two-dimensional Gauss function.

10. In a measurement system comprising a plurality of charged particle beam devices,
   each of the charged particle beam devices being a charged particle beam device that scans a specimen with a primary charged particle beam converged on the specimen and measures dimensions of patterns on the specimen using line profiles obtained by detecting secondary charged particles emitted from the specimen,
   the system comprising:
   means for creating and holding a lookup table associating image shift positions with varying beam diameters of the primary charged particle beam;
   means for storing the image shift positions when obtaining the line profiles;
   means for calculating varying beam diameters when obtaining the line profiles by fitting the stored image shift positions in the lookup table; and
   means for reflecting the calculated varying beam diameters to dimension measurement processing,
   wherein the lookup table is to commonly compensate for dimension values measured by the plurality of charged particle beam devices.

* * * * *